(12) United States Patent
Chabas

(10) Patent No.: US 6,452,457 B1
(45) Date of Patent: *Sep. 17, 2002

(54) ELECTRONIC APPARATUS COMPRISING A POWER AMPLIFIER

(75) Inventor: Jean A. Chabas, Cesson-Sevigne (FR)

(73) Assignee: Koninklijke Philips Electronics N.V., Eindhoven (NL)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/534,212

(22) Filed: Mar. 24, 2000

(30) Foreign Application Priority Data

Mar. 30, 1999 (FR) .............................. 99/03971

(51) Int. Cl.⁷ .................................. H03G 3/20
(52) U.S. Cl. ..................... 330/297; 330/129
(58) Field of Search ............... 330/129, 207 A, 330/251, 297

(56) References Cited

U.S. PATENT DOCUMENTS 5,115,203 A * 5/1992 Krett et al. ................. 330/251
5,497,125 A   3/1996 Royds ........................ 330/290
6,081,161 A * 6/2000 Dacus et al. ................. 330/297

FOREIGN PATENT DOCUMENTS

EP   0558793 A1   9/1993   ............. H03F/1/32
JP   9-181536   *  7/1997   ................ 330/297

OTHER PUBLICATIONS

Ham Radio Outlet Winter 1999 Catalog pp. 72–73, Oct. 15, 1999.*

* cited by examiner

Primary Examiner—Steven J. Mottola
(74) Attorney, Agent, or Firm—Gwenaelle Le Pennec

(57) ABSTRACT

A power control apparatus for minimizing energy losses in a radio transmitter uses a variable-output switched-mode power supply to control a voltage applied to an output power amplifier stage of the radio transmitter. By monitoring a current drawn by the output power amplifier operating in a Class D mode, an error signal is generated that regulates the applied voltage, such that only a minimally-sufficient voltage is supplied to the output amplifier for a given transmitted output power.

3 Claims, 2 Drawing Sheets

ELECTRONIC APPARATUS COMPRISING A POWER AMPLIFIER

DESCRIPTION

The present invention relates to an electronic apparatus comprising:
- a power amplifier for producing a transmit power, formed by:
- a final stage having a supply input for receiving a supply power,
- a measuring circuit for measuring an electrical magnitude applied to said supply input,
- a variable power supply circuit controlled by said measuring circuit for controlling the said transmit power.

The invention also relates to an amplifier suitable for such an apparatus.

The invention finds applications notably in mobile radiotelephony devices for which reduced power consumptions are required to lengthen the discharge period of the accumulator that feeds these devices. The high-frequency transmission amplifier consumes much energy. It is thus interesting to use high-efficiency power amplifier classes. This is the case with class D and others.

U.S. Pat. No. 5,497,125 describes a power amplifier of this type whose output power is controlled on the basis of a measurement of the power consumption. However, in this known amplifier there is a risk that there is non-negligible power dissipation in the current measuring circuit. Furthermore, the change of output power is effected via a variable gain preamplifier that also consumes a little energy.

The present invention proposes an apparatus of the type defined in the opening paragraph which offers reduced power consumption of the control circuit and is largely immune to noise.

Therefore, such an apparatus is characterized in that the said variable power supply circuit comprises:
- a switched-mode power supply circuit having a switched-mode control input for defining its output voltage.

The idea of the invention is to utilize a switched-mode power supply that has the best efficiency.

An important characteristic feature of the invention comprises that said variable power supply circuit further includes a series power supply circuit that has a series control input for defining its output voltage and to which is connected a slaved circuit, so that the voltage difference between the input and the output of the series power supply circuit is minimized. This characteristic feature makes that the series pass transistor which is included in series power supply circuits works to saturation and thus has little energy consumption. Furthermore, the advantage is obtained that the switching noises of the switched-mode power supply are filtered without too much energy consumption.

These and other aspects of the invention are apparent from and will be elucidated, by way of non-limitative example, with reference to the embodiment(s) described hereinafter.

Figure 1:
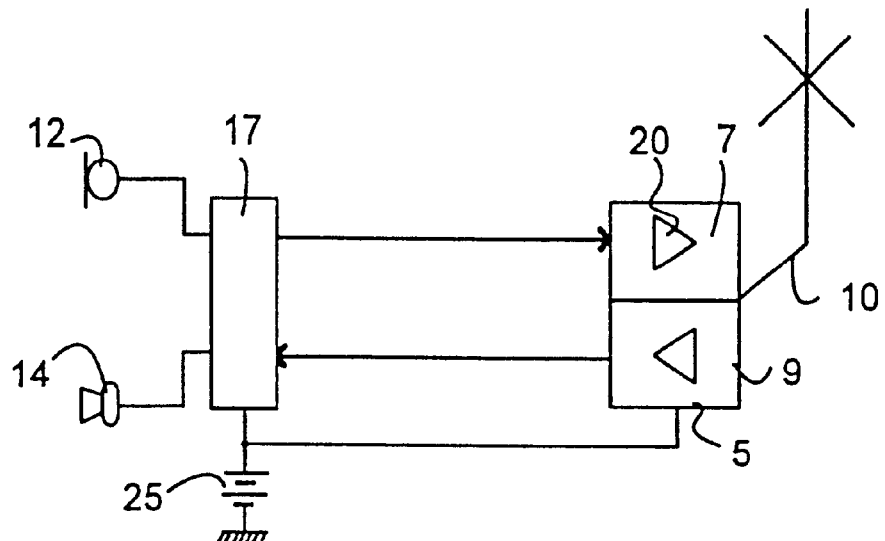
FIG. 1 shows an apparatus in accordance with the invention.

FIG. 1 shows an electronic apparatus in accordance with the invention. This apparatus is a transceiver such as a mobile radio in a cellular network. It comprises a transceiver assembly 5 which has a transmission part 7 and a receiving part 9 for transmitting signals and for receiving them by means of an antenna 10. The signals to be transmitted notably come from a microphone 12 and the signals that are received are notably intended for a loudspeaker 14. A processing element 17 ensures the interface between the low-frequency signals relating to the microphone 12 and the loudspeaker 14 and the assembly 5. The whole is supplied with power via an accumulator 25.

The transceiver assembly comprises a high-frequency amplifier 20 which produces relatively powerful signals.

Figure 2:
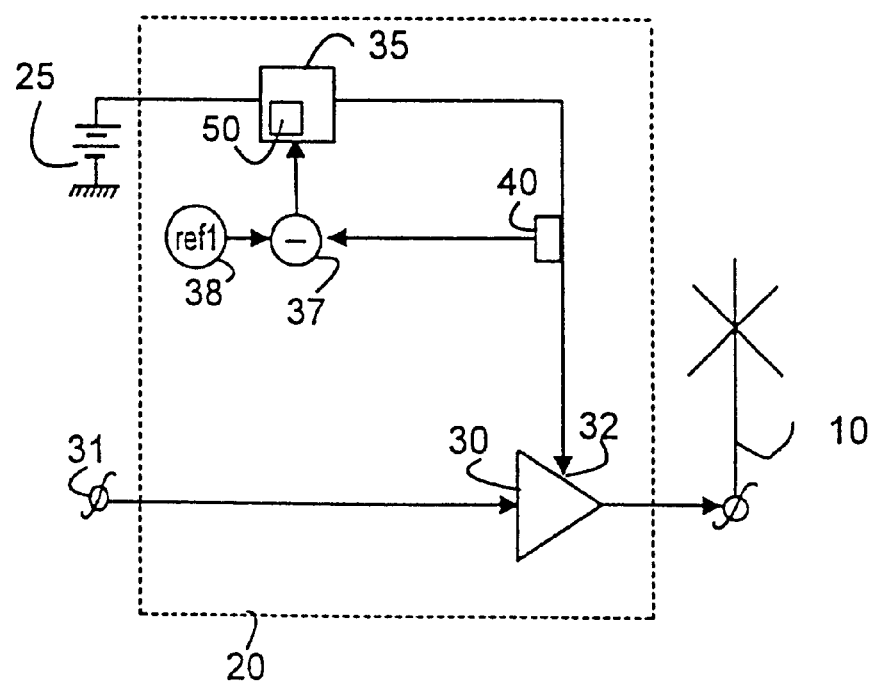
FIG. 2 shows the manufacturing diagram of the amplifier of the apparatus shown in FIG. 1.

This amplifier 20 is shown in detail in FIG. 2. It comprises a final stage 30 intended to amplify the signals applied to its input terminal 31 so as to supply them to the antenna 10. This amplifier is fed through its power supply input 32 by the accumulator 25 followed by a variable power supply regulation circuit 35. This power supply is controlled by a comparator circuit 37 which measures the current supplied by the final stage 30 so as to compare it with a reference value "ref1" produced by a first reference voltage generator 38. A current-tapping circuit 40 taps a well-defined fraction of the supply current from this final stage. This current defines the power produced by this final stage.

In accordance with the invention, the variable power supply circuit 35 comprises a switched-mode power supply circuit 50.

Figure 3:
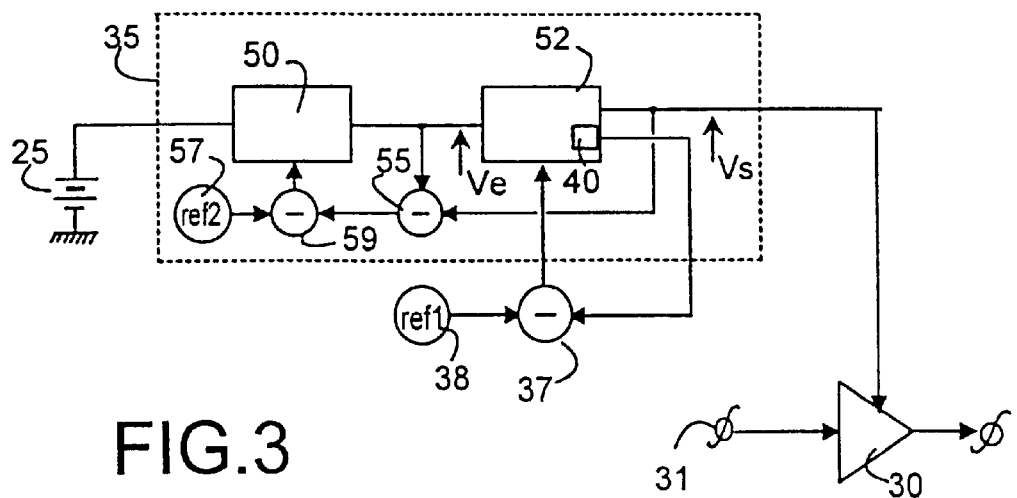
FIG. 3 shows a more detailed diagram of the amplifier according to the invention, FIG. 4 explains the current tapping circuit, and FIG. 5 explains the structure of an amplifier working in class D.

FIG. 3 shows in more detail the embodiment of the invention. To the switched-mode power supply circuit 50, whose input is directly connected to a terminal of the accumulator 25, is associated a series power supply circuit 52. The structure of this circuit 52 is profited from for realizing the current-tapping circuit in a manner that will be explained with the aid of FIG. 4.

According to the embodiment represented in FIG. 3, the switched-mode power supply circuit 50 receives a switch control voltage that depends on the difference between the voltages <<Ve>> and <<Vs>> which exists between the input and output of the series power supply circuit 52. This difference is formed by a subtracter circuit 55. The output voltage of this circuit 55 is compared with a reference voltage "ref2" produced by a second reference voltage generator 57 by means of a subtracter circuit 59 which produces voltage at the serial command of the power supply circuit 52. The generator 57 produces a sufficiently low voltage to avoid energy dissipation via the series power supply circuit 52 since it sets the difference <<Vs−Ve>> to a low value. The output voltage <<Vs>> of the series power supply circuit is set by the comparator circuit 37, as has already been observed.

Thus, as a result of this double slave control, the first one involving the switched-mode power supply circuit 50 providing a good energy efficiency, and the second one involving the series power supply circuit 52 eliminating the switching disturbances of the switched-mode power supply circuit 50, not much energy is spent, because the voltage between its input and its output is kept low.

Figure 4:
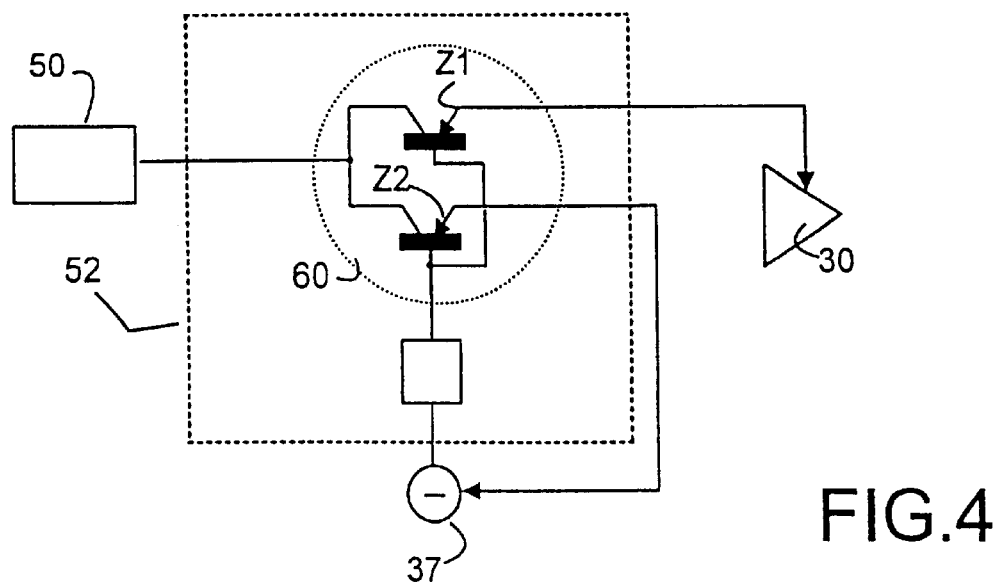

FIG. 4 shows how the tapping circuit 40 is built up. Reference 60 indicates the pass transistor of the series circuit. This transistor has a plurality of emitter zones: the largest part Z1 is used for feeding the amplifier 30 and a single zone Z2 is used for being applied to the comparator 37.

Figure 5:
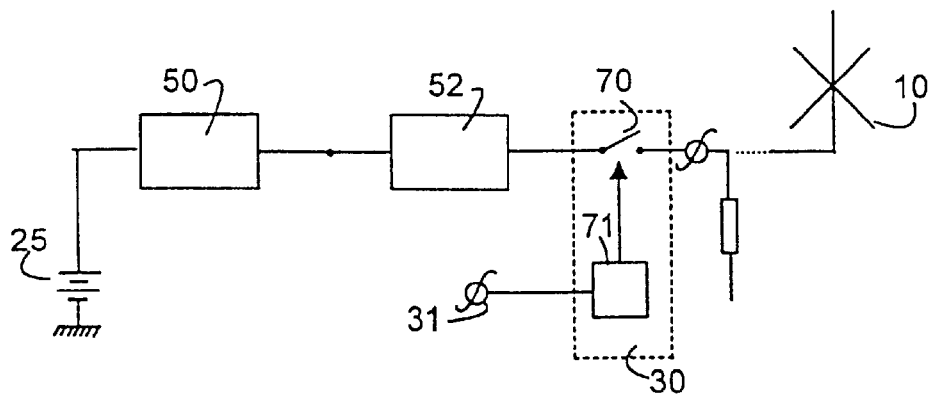

FIG. 5 diagrammatically shows the operation of an amplifier 30 operating in class D. Such an amplifier is formed from a switching circuit 70 which is opened and closed by means of a control circuit 71. Thus, the switch is opened and closed as a function of the signals applied to the input terminal 31. Thus, via the power supply circuits 50 and 52 the supply voltage is applied directly to the load which is formed by the antenna 10.

Thanks to the invention, one has gained control of the power produced by the amplifier 30. This power is defined by the generator 38 which may produce variable references according to the needs.

What is claimed is:

1. An electronic apparatus comprising:

a power amplifier for producing a transmit power to an antenna, formed by:

a final stage having a supply input for receiving a supply power, a measuring circuit for measuring an electrical magnitude applied to said supply input, a variable power supply circuit controlled by said measuring circuit for controlling the said transmit power, characterized in that the said variable power supply circuit further includes a series power supply circuit which has a series control input for defining its output voltage and to which is connected a slave circuit so that the difference of voltage between the input and the output of the series power supply circuit is minimized; and a switched-mode power supply circuit having a switched-mode control input for defining its output voltage.

2. An apparatus as claimed in claim 1, characterized in that the slave circuit comprises a comparator for comparing said difference with a set voltage so as to influence said series control input.

3. An amplifier suitable for use in an apparatus as claimed in claim 1.

* * * * *